(12) United States Patent
Lian et al.

(10) Patent No.: US 12,347,724 B2
(45) Date of Patent: *Jul. 1, 2025

(54) SURFACE MODIFICATION LAYER FOR CONDUCTIVE FEATURE FORMATION

(71) Applicant: Taiwan Semiconductor Manufacturing Co., Ltd., Hsinchu (TW)

(72) Inventors: Jian-Jou Lian, Tainan (TW); Kuo-Bin Huang, Jhubei (TW); Neng-Jye Yang, Hsinchu (TW); Li-Min Chen, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/586,925

(22) Filed: Feb. 26, 2024

(65) Prior Publication Data

US 2024/0194522 A1 Jun. 13, 2024

Related U.S. Application Data

(63) Continuation of application No. 18/178,948, filed on Mar. 6, 2023, now Pat. No. 11,942,362, which is a
(Continued)

(51) Int. Cl.
  *H01L 21/00* (2006.01)
  *H01L 21/02* (2006.01)
(Continued)

(52) U.S. Cl.
  CPC .......... *H01L 21/76823* (2013.01); *H01L 21/02307* (2013.01); *H01L 21/30604* (2013.01);
(Continued)

(58) Field of Classification Search
  CPC .......... H01L 23/5226; H01L 23/5329; H01L 23/53295; H01L 21/02337;
(Continued)

(56) References Cited

U.S. PATENT DOCUMENTS 4,360,393 A 11/1982 Koval
6,559,070 B1 5/2003 Mandal
(Continued)

FOREIGN PATENT DOCUMENTS

DE 102014109444 A1 11/2015
JP 2003142461 A 5/2003
(Continued)

*Primary Examiner* — Reema Patel
(74) *Attorney, Agent, or Firm* — Slater Matsil, LLP

(57) ABSTRACT

Embodiments described herein relate generally to methods for forming a conductive feature in a dielectric layer in semiconductor processing and structures formed thereby. In some embodiments, a structure includes a dielectric layer over a substrate, a surface modification layer, and a conductive feature. The dielectric layer has a sidewall. The surface modification layer is along the sidewall, and the surface modification layer includes phosphorous and carbon. The conductive feature is along the surface modification layer.

20 Claims, 7 Drawing Sheets

Related U.S. Application Data continuation of application No. 16/914,788, filed on Jun. 29, 2020, now Pat. No. 11,600,521, which is a continuation of application No. 16/145,457, filed on Sep. 28, 2018, now Pat. No. 10,699,944.

(51) Int. Cl.
  *H01L 21/306* (2006.01)
  *H01L 21/48* (2006.01)
  *H01L 21/768* (2006.01)
  *H01L 23/522* (2006.01)
  *H01L 23/532* (2006.01)

(52) U.S. Cl.
  CPC .... *H01L 21/4857* (2013.01); *H01L 21/76814* (2013.01); *H01L 21/76826* (2013.01); *H01L 21/76831* (2013.01); *H01L 23/5226* (2013.01); *H01L 23/5329* (2013.01)

(58) Field of Classification Search
  CPC ......... H01L 21/02343; H01L 21/76822; H01L 21/76826; H01L 21/76829; H01L 21/76831
  See application file for complete search history.

(56) References Cited

U.S. PATENT DOCUMENTS

| | | |
|---|---|---|
| 8,736,056 B2 | 5/2014 | Lee et al. |
| 10,699,944 B2 | 6/2020 | Lian et al. |
| 11,600,521 B2 | 3/2023 | Lian et al. |
| 2003/0148624 A1 | 8/2003 | Ikemoto et al. |
| 2004/0222529 A1* | 11/2004 | Dostalik ........... H01L 21/76831 257/E23.145 |
| 2005/0108949 A1 | 5/2005 | Matsuda et al. |
| 2006/0071340 A1 | 4/2006 | Zhong et al. |
| 2008/0217046 A1 | 9/2008 | Tang et al. |
| 2008/0314288 A1 | 12/2008 | Biro et al. |
| 2009/0121353 A1* | 5/2009 | Ramappa ........... H01L 21/76808 438/653 |
| 2010/0048006 A1 | 2/2010 | Huang et al. |
| 2014/0377947 A1 | 12/2014 | Ishizaka et al. |
| 2015/0048516 A1 | 2/2015 | Lu et al. |
| 2015/0380302 A1 | 12/2015 | Mountsier et al. |
| 2016/0056071 A1 | 2/2016 | Draeger et al. |
| 2017/0005038 A1 | 1/2017 | Lee et al. |
| 2017/0074823 A1 | 3/2017 | Morimitsu |
| 2017/0117225 A1* | 4/2017 | Adusumilli ....... H01L 21/76877 |
| 2017/0194242 A1* | 7/2017 | Huang .............. H01L 21/76813 |
| 2018/0096932 A1* | 4/2018 | Xie .................. H01L 21/76816 |

FOREIGN PATENT DOCUMENTS

| | | |
|---|---|---|
| KR | 20020054720 A | 7/2002 |
| KR | 100726523 B1 | 6/2007 |
| KR | 20140128347 A | 11/2014 |
| KR | 20160002391 A | 1/2016 |
| WO | 2009045718 A1 | 4/2009 |

* cited by examiner

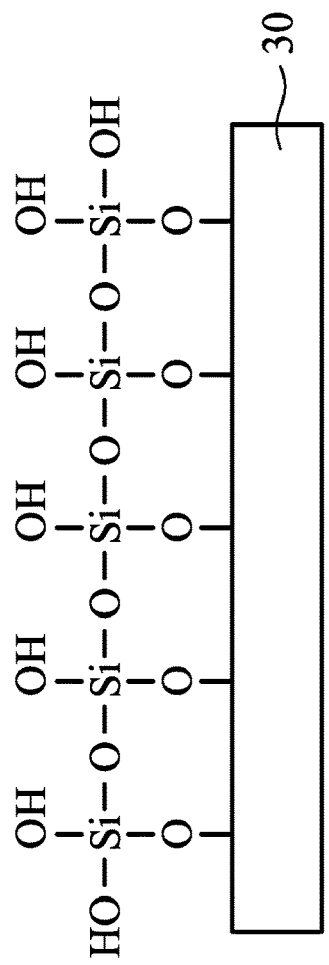
FIG. 7A
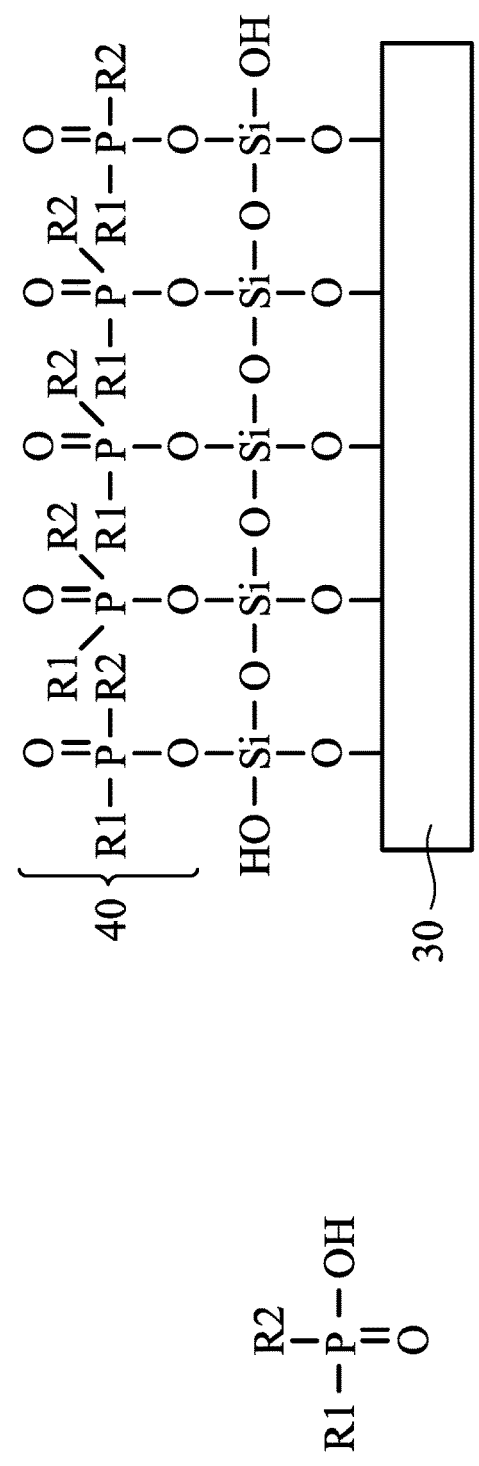
FIG. 7B
FIG. 7C

SURFACE MODIFICATION LAYER FOR CONDUCTIVE FEATURE FORMATION

PRIORITY CLAIM AND CROSS-REFERENCE

This application is a continuation of U.S. patent application Ser. No. 18/178,948, entitled "Surface Modification Layer for Conductive Feature Formation," filed on Mar. 6, 2023, which is a continuation of U.S. patent application Ser. No. 16/914,788, entitled "Surface Modification Layer for Conductive Feature Formation," filed on Jun. 29, 2020, now U.S. Pat. No. 11,600,521, issued Mar. 7, 2023, which is a continuation of U.S. patent application Ser. No. 16/145,457, entitled "Surface Modification Layer for Conductive Feature Formation," filed on Sep. 28, 2018, now U.S. Pat. No. 10,699,944, issued on Jun. 30, 2020, which applications are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A, 7B, and 7C are a mechanism for forming a surface modification layer in accordance with some embodiments.

DETAILED DESCRIPTION

Figure 1:
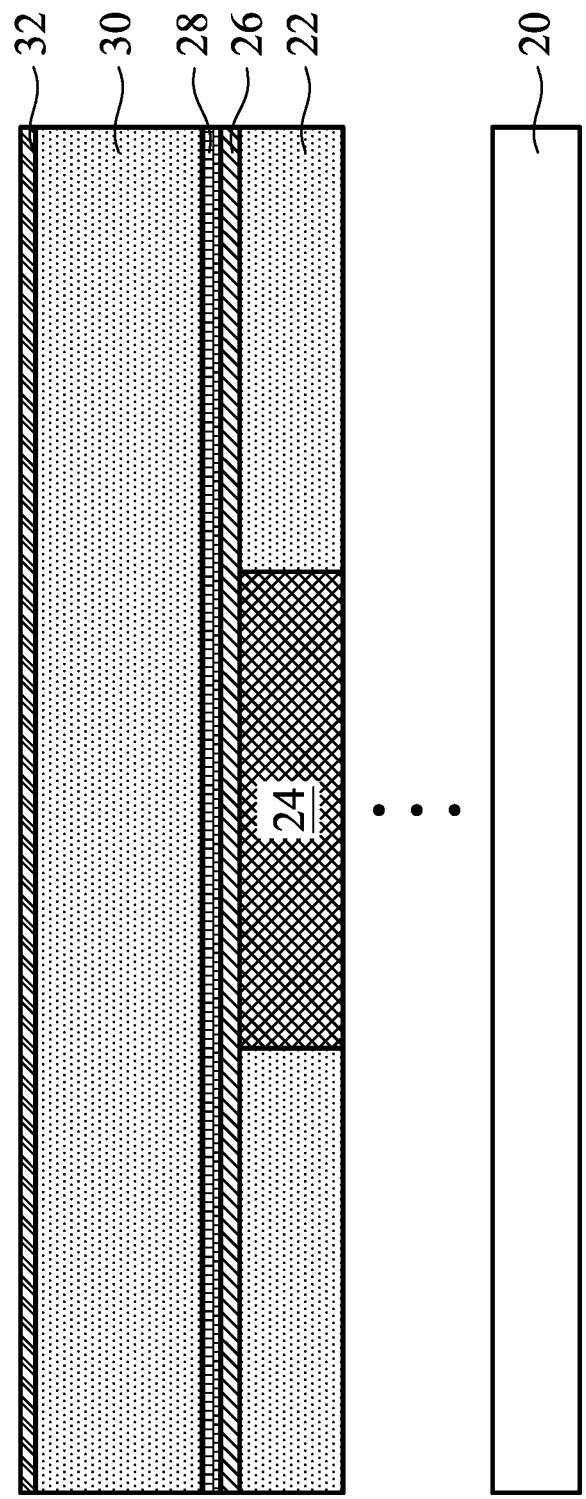
FIGS. 1 through 6 are cross-sectional views of respective intermediate structures during an example method for forming a conductive feature in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate generally to methods for forming a conductive feature in a dielectric layer in semiconductor processing and structures formed thereby. In some embodiments, surfaces of the dielectric layer that define an opening in which the conductive feature is formed are treated with a phosphoric acid derivative to form a surface modification layer on those surfaces. The conductive feature is then formed in the opening and on the surface modification layer. The surface modification layer can, among other things, repair damage to the dielectric layer that may be caused by the formation of the opening through the dielectric layer. Other advantages or benefits may also be achieved.

Some embodiments described herein are in the context of Back End of the Line (BEOL) processing. Other processes and structures within the scope of other embodiments may be performed in other contexts, such as in Middle End of the Line (MEOL) processing and other contexts. Various modifications are discussed with respect to disclosed embodiments; however, other modifications may be made to disclosed embodiments while remaining within the scope of the subject matter. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIGS. 1 through 6 illustrate cross-sectional views of respective intermediate structures during an example method for forming a conductive feature in accordance with some embodiments. FIG. 1 illustrates a first dielectric layer 22 over a semiconductor substrate 20. The semiconductor substrate 20 may be or include a bulk semiconductor, a semiconductor-on-insulator (SOI) substrate, or the like, which may be doped (e.g., with a p-type or an n-type dopant) or undoped. In some embodiments, the semiconductor material of the semiconductor substrate 20 may include elemental semiconductor like silicon (Si) and germanium (Ge); a compound semiconductor; an alloy semiconductor; or a combination thereof.

Various devices may be on the semiconductor substrate 20. For example, the semiconductor substrate 20 may include Field Effect Transistors (FETs), such as Fin FETs (FinFETs), planar FETs, vertical gate all around FETs (VGAA FETs), or the like; diodes; capacitors; inductors; and other devices. Devices may be formed wholly within the semiconductor substrate 20, in a portion of the semiconductor substrate 20 and a portion of one or more overlying layers, and/or wholly in one or more overlying layers, for example. Processing described herein may be used to form and/or to interconnect the devices to form an integrated circuit. The integrated circuit can be any circuit, such as for an Application Specific Integrated Circuit (ASIC), a processor, memory, or other circuit.

The first dielectric layer 22 is above the semiconductor substrate 20. The first dielectric layer 22 may be directly on the semiconductor substrate 20, or any number of other layers may be disposed between the first dielectric layer 22 and the semiconductor substrate 20. For example, the first dielectric layer 22 may be or include an Inter-Metal Dielectric (IMD). The first dielectric layer 22, for example, may be or comprise a low-k dielectric having a k-value less than about 4.0, such as about 2.0 or even less. In some examples, the first dielectric layer 22 comprises silicon oxide, phosphosilicate glass (PSG), borophosphosilicate glass (BPSG), fluorosilicate glass (FSG), $SiO_xC_y$, silicon carbon material, a compound thereof, a composite thereof, or a combination thereof.

A conductive feature 24 is in and/or through the first dielectric layer 22. The conductive feature 24 may be or include a conductive line and/or a conductive via. For example, the first dielectric layer 22 may be an IMD, and the conductive feature 24 may include a conductive line and/or a conductive via (collectively or individually, "interconnect structure"). The interconnect structure may be formed by forming an opening and/or recess through and/or in the IMD, for example, using a damascene process. The interconnect structure can include, for example, a barrier layer and/or a surface modification layer (as described herein) along sidewalls of the first dielectric layer 22 and a metal fill material (e.g., copper, etc.).

A first etch stop sub-layer 26 is over the first dielectric layer 22 and the conductive feature 24, and a second etch stop sub-layer 28 is over the first etch stop sub-layer 26. An etch stop layer can provide a mechanism to stop an etch process when forming, e.g., conductive vias. An etch stop layer may be formed of a dielectric material having a different etch selectivity from adjacent layers or components. The first etch stop sub-layer 26 is deposited on the top surfaces of the first dielectric layer 22 and the conductive feature 24, and the second etch stop sub-layer 28 is deposited on the top surface of the first etch stop sub-layer 26. The first etch stop sub-layer 26 and the second etch stop sub-layer 28 are formed of different materials such that each layer has a different etch selectivity for etch stopping purposes. The first etch stop sub-layer 26 and the second etch stop sub-layer 28 may each comprise or be silicon nitride, silicon oxynitride, silicon oxide, silicon carbon nitride, carbon nitride, the like, or a combination thereof, and may be deposited by chemical vapor deposition (CVD), plasma enhanced CVD (PECVD), atomic layer deposition (ALD), or another deposition technique. For example, the first etch stop sub-layer 26 can be silicon oxynitride, and the second etch stop sub-layer 28 can be silicon nitride. A thickness of the first etch stop sub-layer 26 can be in a range from about 1 nm to about 10 nm, and a thickness of the second etch stop sub-layer 28 can be in a range from about 1 nm to about 10 nm.

A second dielectric layer 30 is over the second etch stop sub-layer 28. For example, the second dielectric layer 30 may be or include an IMD. The second dielectric layer 30 is deposited on the top surface of the second etch stop sub-layer 28. The second dielectric layer 30, for example, may be or comprise a low-k dielectric having a k-value less than about 4.0, such as in a range from about 2.0 to about 3.0, or even less. In some examples, the second dielectric layer 30 comprises or is silicon oxide, a silicon oxide-like material, PSG, BPSG, FSG, $SiO_xC_y$, a silicon carbon material, a compound thereof, a composite thereof, or a combination thereof. The second dielectric layer 30 may be deposited using CVD, such as PECVD or Flowable CVD (FCVD); spin-on coating; or another deposition technique. In some examples, a Chemical Mechanical Planarization (CMP) or another planarization process may be performed to planarize the top surface of second dielectric layer 30. A thickness of the second dielectric layer 30 can be in a range from about 20 nm to about 100 nm.

A hardmask 32 is over the second dielectric layer 30. The hardmask 32 can be implemented for subsequently etching an opening through the second dielectric layer 30. The hardmask 32 may comprise or be silicon oxide formed by tetraethoxysilane (TEOS), silicon nitride, silicon carbon nitride, carbon nitride, titanium nitride, the like, or a combination thereof, and may be deposited by CVD, physical vapor deposition (PVD), or another deposition technique. A thickness of the hardmask 32 can be in a range from about 8 nm to about 50 nm.

The configuration of FIG. 1 is an example to illustrate aspects herein. In other examples, various other layers may be included, omitted, and/or modified. A person having ordinary skill in the art will readily understand various modifications that may be made.

Figure 2:
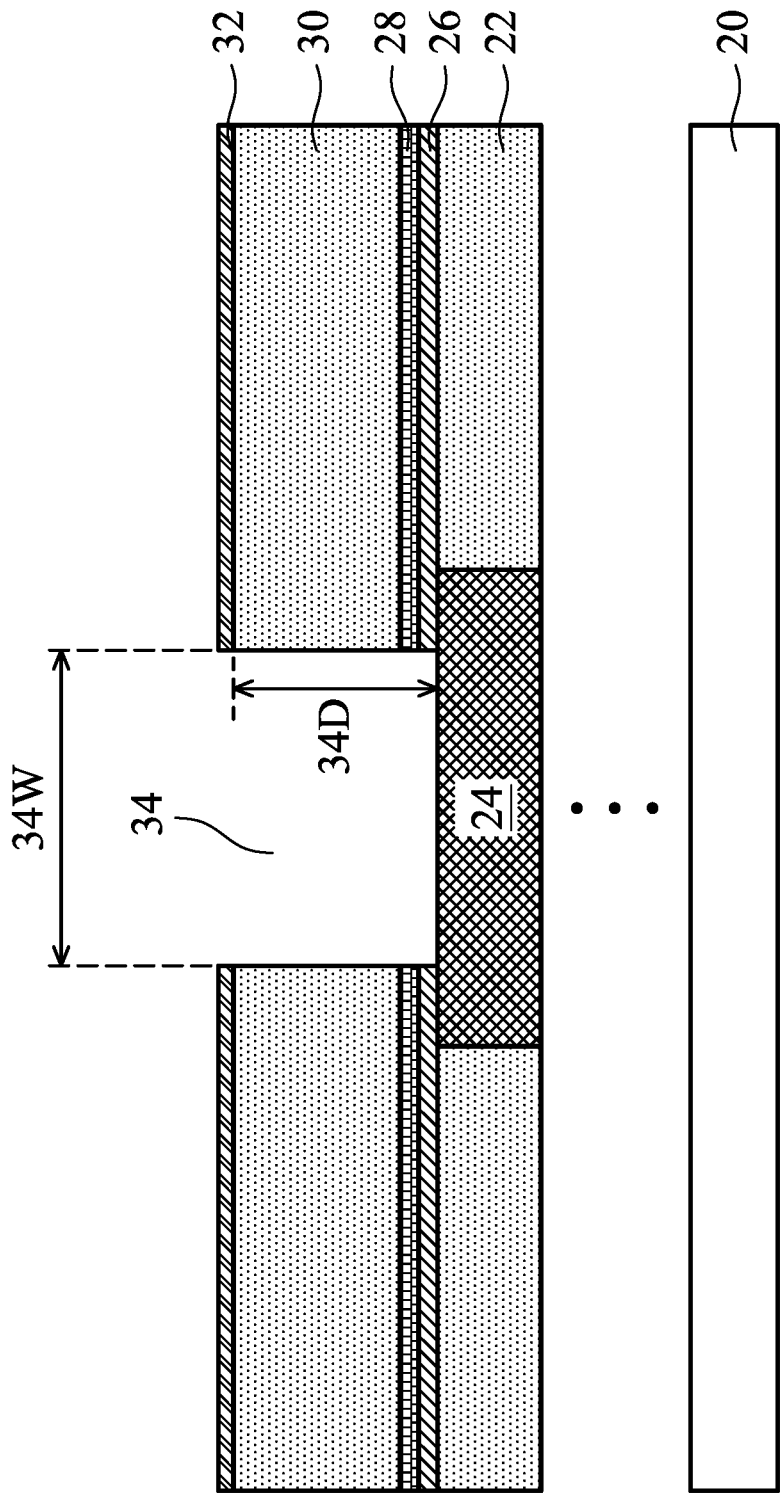

FIG. 2 illustrates the formation of an opening 34 in and/or through the hardmask 32, second dielectric layer 30, second etch stop sub-layer 28, and first etch stop sub-layer 26 to the conductive feature 24. The opening 34 can be or include a via opening, a trench, and/or the like. The opening 34 can be formed using photolithography and etch processes, such as in a damascene process. The etch process may include a reactive ion etch (RIE) or another etch process. The etch process may be anisotropic.

More specifically, in some examples, the opening 34 is formed using an RIE process, a wet clean process, a baking process, and a post-clean process. In some examples, the RIE process is implemented to etch through the second dielectric layer 30. In some examples, the RIE process etches through the second dielectric layer 30 and stops at the second etch stop sub-layer 28. The RIE process can implement an etchant gas comprising a carbon fluoride ($C_xF_y$) gas and/or another gas. The RIE process can further use a carrier gas, such as argon (Ar) or the like. A flow rate of the etchant gas can be in a range from about 20 sccm to about 500 sccm, and a flow rate of the carrier gas can be in a range from about 20 sccm to about 500 sccm. A ratio of the flow rate of the etchant gas to the flow rate of the carrier gas can be in a range from about 1 to about 25. A pressure of the RIE process can be in a range from about 1 mTorr to about 100 mTorr. A temperature of the RIE process can be in a range from about 0° C. to about 100° C. The RIE process can implement an inductively coupled plasma (ICP). The plasma generator of the RIE process can have a power in a range from about 50 W to about 1800 W and at frequency in a range from about 2 MHz to about 80 MHz, such as 13.56 MHz. A substrate bias of the RIE process can be in a range from about 50 V to about 1.8 kV. Other examples can implement other etch processes and/or parameters. The parameters can be tuned to be within or outside of the various ranges described above based on design considerations such as materials implemented and/or profile of the opening 34.

Thereafter, a wet clean process is implemented to remove residue from the RIE process and break through the second etch stop sub-layer 28 and the first etch stop sub-layer 26 to expose the conductive feature 24. In some examples, the wet clean process implements a solution comprising a fluoride acid and an organic solvent. For example, the solution can comprise hydrofluoric (HF) acid and a glycol. The solution can have a ratio of the fluoride acid to the organic solvent in a range from about 1:10 (by volume) to about 1:5000 (by volume). The solution may be at a temperature in a range from about 20° C. to about 60° C., and may be applied for a duration in a range from about 0.1 minutes to about 5 minutes. The solution can be applied by spin-on, immersion, or any other technique.

After the wet clean process, a mild bake process can be performed to drive moisture out of the intermediate structure of FIG. 2. The mild bake process can be performed at a temperature in a range from about 200° ° C. to about 400° C., such as about 300° C., for a duration in a range from about 5 minutes to about 10 minutes.

In some examples, as a result of the etch and wet clean processes, an oxide can be formed on the exposed top surface of the conductive feature 24, and the post-clean process can be performed to remove the oxide on the conductive feature 24. The post-clean process can include an ion bombardment, a plasma treatment with a forming gas, and/or rinse in citric acid, for example.

The sidewalls of the opening 34 are illustrated as being vertical. In other examples, sidewalls of the opening 34 may taper together in a direction toward or away from the bottom of the opening 34. For example, the opening 34 may have a positive taper profile or a reentrant profile.

As illustrated, the opening 34 has a width 34W and a depth 34D. The width 34W is in a plane of the top surface of the second dielectric layer 30. The depth 34D is from the top surface of the second dielectric layer 30 to the exposed surface of the conductive feature 24. The width 34W can be in a range from about 5 nm to about 40 nm, and the depth 34D can be in a range from about 30 nm to about 100 nm. An aspect ratio of the depth 34D to the width 34W can be in a range from about 3 to about 6. A person having ordinary skill in the art will readily understand that various dimensions, such as thicknesses of layers and depth and width of the opening 34, can vary depending on the technology node of the process and layer of the structure being formed. For example, conductive features in lower IMD layers generally have a smaller width than conductive features in upper IMD layers.

Figure 3:
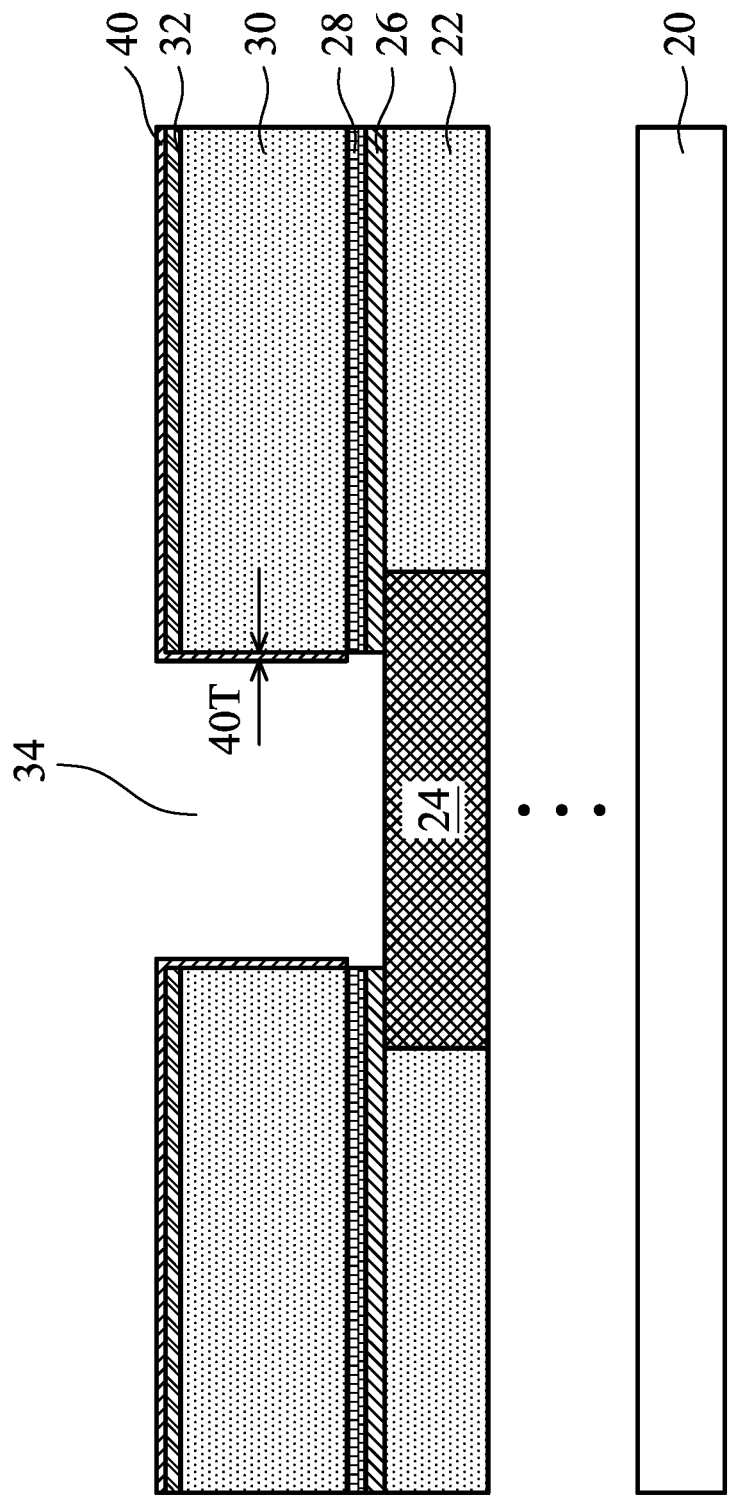

FIG. 3 illustrates the formation of a surface modification layer 40 in the opening 34 along the sidewalls of the second dielectric layer 30 and on the top surface of the hardmask 32. The surface modification layer 40, in some examples, is a self-aligned monolayer (SAM) that repairs damage to surfaces of the second dielectric layer 30. In some examples, surfaces of the second dielectric layer 30 can be damaged during plasma processes, such as an RIE process that forms the opening 34. For example, the plasma process can deplete the surface of carbon. Further, some processes, such as a wet clean process, can terminate surfaces of the second dielectric layer 30 with hydroxide (—OH) groups. Individually and/or together, the depletion of carbon and the termination with hydroxide groups can cause the dielectric value (k-value) of the second dielectric layer 30 to increase. The surface modification layer 40 can remove the hydroxide groups and replenish carbon at the surfaces of the second dielectric layer 30 to repair the second dielectric layer 30. The surface modification layer 40 is a dielectric material and is free from metal, in some embodiments.

In some examples, the surface modification layer 40 includes a monolayer of a molecule comprising phosphorous and one or more organic functional groups. In some examples, the surface modification layer 40 is formed by exposing the surfaces of the second dielectric layer 30 to a phosphoric acid derivative. The phosphoric acid derivative has the general chemical structure of an oxygen atom double bonded to a phosphorous atom, a hydroxide group single bonded to the phosphorous atom, and two organic functional groups each single bonded to the phosphorous atom. In some examples, the organic functional groups are or include functional groups of alky, alkoxy, amine, ester, phenyl, the like, or a combination thereof. In some examples, the phosphoric acid derivative is or includes Di-(2-ethylhexyl) phosphoric acid, dihexylphosphoric acid, ethyl hexadecyl phosphate, n-Butyl-octyl-hydrogenphosphate, diisoamylphosphoric acid, ethyl octyl phosphate, the like, or a combination thereof.

In some examples, the phosphoric acid derivative is exposed to the surfaces of the second dielectric layer 30 using a wet process or a dry process. In some examples, a wet process is implemented. The wet process can include using a solution comprising the phosphoric acid derivative and an organic solvent. Example organic solvents include ethylene glycol, diethanolglycol (DEG), glycol ethers, the like, or a combination thereof. The solution can include the phosphoric acid derivative and organic solvent at a ratio in a range from about 1:100000 (phosphoric acid derivative: organic solvent) (by volume) to about 1:100 (phosphoric acid derivative:organic solvent) (by volume). The wet process, in some examples, includes using a spin coating process to apply the solution to the surfaces of the second dielectric layer 30. The solution may be at a temperature in a range from about 20° C. to about 60° C., and may be applied for a duration in a range from about 0.1 minutes to about 10 minutes. If too low of an amount or concentration of the phosphoric acid derivative is implemented (e.g., if a ratio of the phosphoric acid derivative to solvent is too low and/or the duration is too short), the phosphoric acid derivative may not react sufficiently to form the surface modification layer 40. After the solution is applied, a rinse process may be performed to remove any remaining solution and by-products. The rinse process can include rinsing with a mixture of deionized water and isopropyl alcohol (IPA) followed by rinsing with IPA for drying.

In some examples, a dry process is implemented. The dry process can include flowing one or more gases over the surfaces of the second dielectric layer 30. The one or more gases include a phosphoric acid derivative, and can further include a carrier gas, such as nitrogen ($N_2$), argon (Ar), or the like. The dry process can be performed without using a plasma. The phosphoric acid derivative gas can be flowed at a flow rate in a range from about 1 sccm to about 100 sccm, and a carrier gas, if used, can be flowed at a flow rate in a range from about 50 sccm to about 500 sccm. A ratio of the flow rate of the phosphoric acid derivative gas to the flow rate of the carrier gas can be in a range from about 1:50 to about 1:500. A pressure of the ambient of the dry process can be in a range from about 10 mTorr to about 1 Torr, and a temperature of the dry process can be in a range from about 20° C. to about 100° C. A duration of the dry process can be in a range from about 0.1 minutes to about 10 minutes. If too low of an amount or concentration of the phosphoric acid derivative gas is implemented (e.g., if a flow rate is too low and/or the duration is too short), the phosphoric acid derivative gas may not react sufficiently to form the surface modification layer 40. After the exposure, a purge process can be implemented, such as by flowing an inert gas like argon (Ar), to remove any remaining phosphoric acid derivative gas and by-products.

FIGS. 7A, 7B, and 7C illustrate a mechanism for forming the surface modification layer 40 in accordance with some embodiments. FIG. 7A illustrates a surface of the second dielectric layer 30, which is formed as described above. The surface includes silicon oxide that is terminated with hydroxide groups, which can be the result of damage to the second dielectric layer 30, as described above. FIG. 7B illustrates the general chemical structure of a phosphoric acid derivative. The phosphoric acid derivative includes a phosphorous atom (i) double bonded to an oxygen atom (O), (ii) single bonded to a hydroxide group (—OH), (iii) single bonded to a first organic functional group (R1), and (iv) single bonded to a second organic functional group (R2). The phosphoric acid derivative of FIG. 7B is exposed to the surface of the second dielectric layer 30 of FIG. 7A using a wet or dry process as described above. The phosphoric acid derivative reacts with the surface of the second dielectric layer 30 to form the surface modification layer 40. The reaction results in a bridging oxygen atom that forms bonds with silicon (Si) and the phosphorous of the phosphoric acid derivative and results in a by-product of water vapor ($H_2O$). The surface modification layer 40 that is formed includes a monolayer of molecules, where each molecule includes phosphorous, oxygen, the first organic functional groups R1, and the second organic functional groups R2. By-products and residual fluids can be removed by the rinsing or purging described above.

Referring back to FIG. 3, the surface modification layer 40 has a thickness 40T. The thickness 40T is in a range from about 1 nm to about 2 nm in some examples. With the reactions that occur as described previously, the formation of the surface modification layer 40 may be self-limiting since reactions can saturate when the reaction sites on the surfaces of the second dielectric layer 30 react with the phosphoric acid derivative.

Further, in some examples, the surface modification layer 40 is selectively formed on the surfaces of the second dielectric layer 30 but not on an exposed surface of the conductive feature 24. Additionally, in some examples, the surface modification layer 40 may not be formed on surfaces of the first etch stop sub-layer 26 and the second etch stop sub-layer 28. As illustrated in FIGS. 7A through 7C, a chemical reaction between the surface of the second dielectric layer 30 and the phosphoric acid derivative forms the surface modification layer 40. Since the surfaces of the conductive feature 24, first etch stop sub-layer 26, and second etch stop sub-layer 28 are materials different from the second dielectric layer 30, and hence, have a different chemical structure from the second dielectric layer 30, those surfaces may not react with the phosphoric acid derivative, and hence, a surface modification layer 40 may not be formed on those surfaces in some examples. For example, the removal of an oxide from the exposed surface of the conductive feature 24 after the opening 34 is formed, as described above, can result in a metallic surface without oxygen being on the exposed surface of the conductive feature 24. This metallic surface may not be able to react with the phosphoric acid derivative, and hence, a surface modification layer 40 may not be formed on the metallic surface in some examples.

Figure 4:
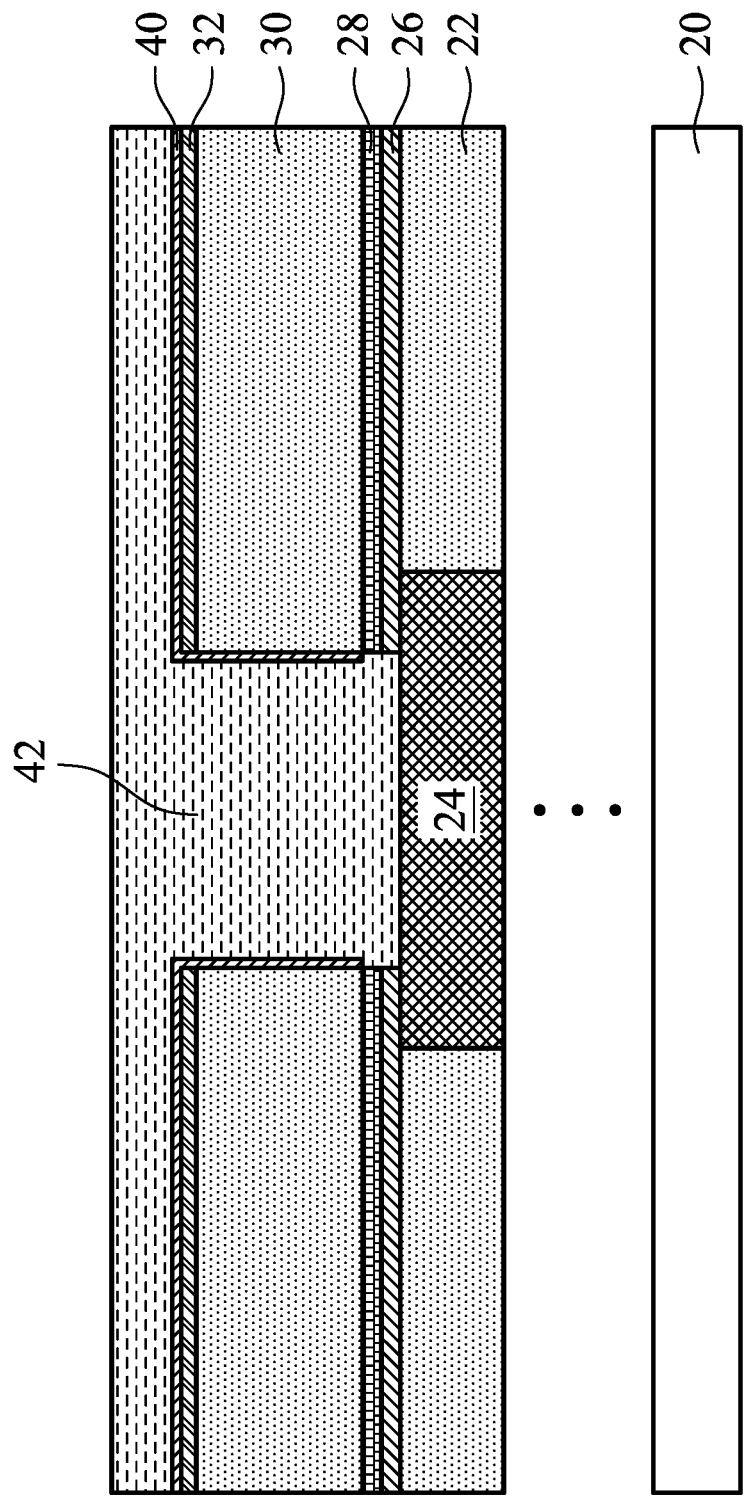

FIG. 4 illustrates the formation of a conductive fill material 42 on the surface modification layer 40, which fills the opening 34. The conductive fill material 42 can be or include a metal fill, such as copper, tungsten, cobalt, aluminum, ruthenium, the like, or a combination thereof. The conductive fill material 42 can be deposited by any acceptable deposition process, such as PVD, plating (e.g., electroless plating), CVD, the like, or a combination thereof.

Figure 5:
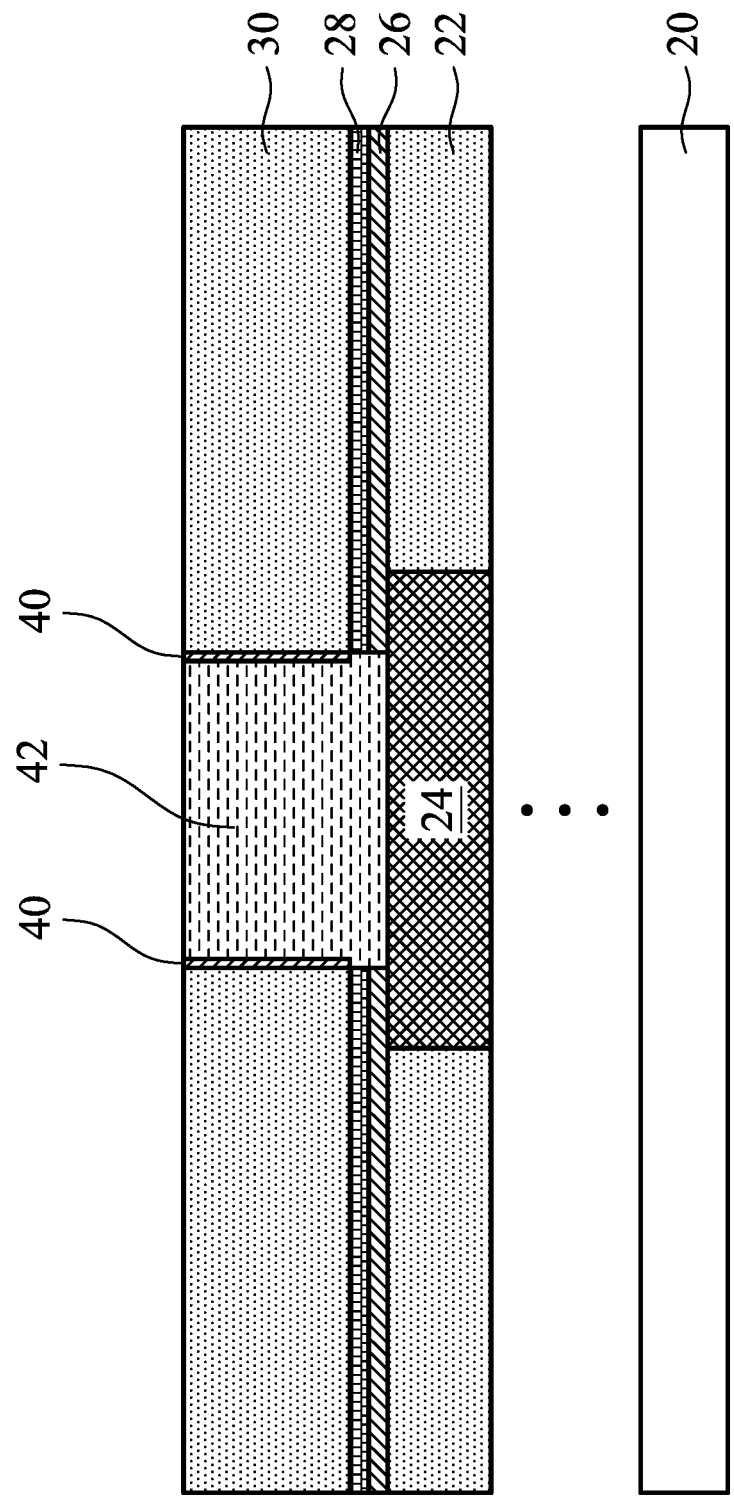

FIG. 5 illustrates the removal of the hardmask 32, the surface modification layer 40 formed on the hardmask 32, and excess conductive fill material 42 to form a conductive feature (comprising the conductive fill material 42) in the second dielectric layer 30. The hardmask 32, the surface modification layer 40 formed on the hardmask 32, and excess conductive fill material 42 can be removed using a planarization process, such as a CMP, which can form upper surfaces of the conductive fill material 42, surface modification layer 40, and second dielectric layer 30 to be level. A conductive feature, such as in a damascene interconnect structure, can be formed, as illustrated in FIG. 5. More specifically, the conductive feature (e.g., conductive fill material 42) contacts the surface modification layer 40 on sidewalls of the second dielectric layer 30, contacts the top surface of the conductive feature 24, and, if the surface modification layer 40 is not formed on the sidewalls of the first etch stop sub-layer 26 and second etch stop sub-layer 28, contacts the sidewalls of the first etch stop sub-layer 26 and second etch stop sub-layer 28. Further, the surface modification layer 40 is disposed between the conductive feature (e.g., conductive fill material 42) and the second dielectric layer 30 and is laterally around the conductive feature (e.g., conductive fill material 42).

Figure 6:
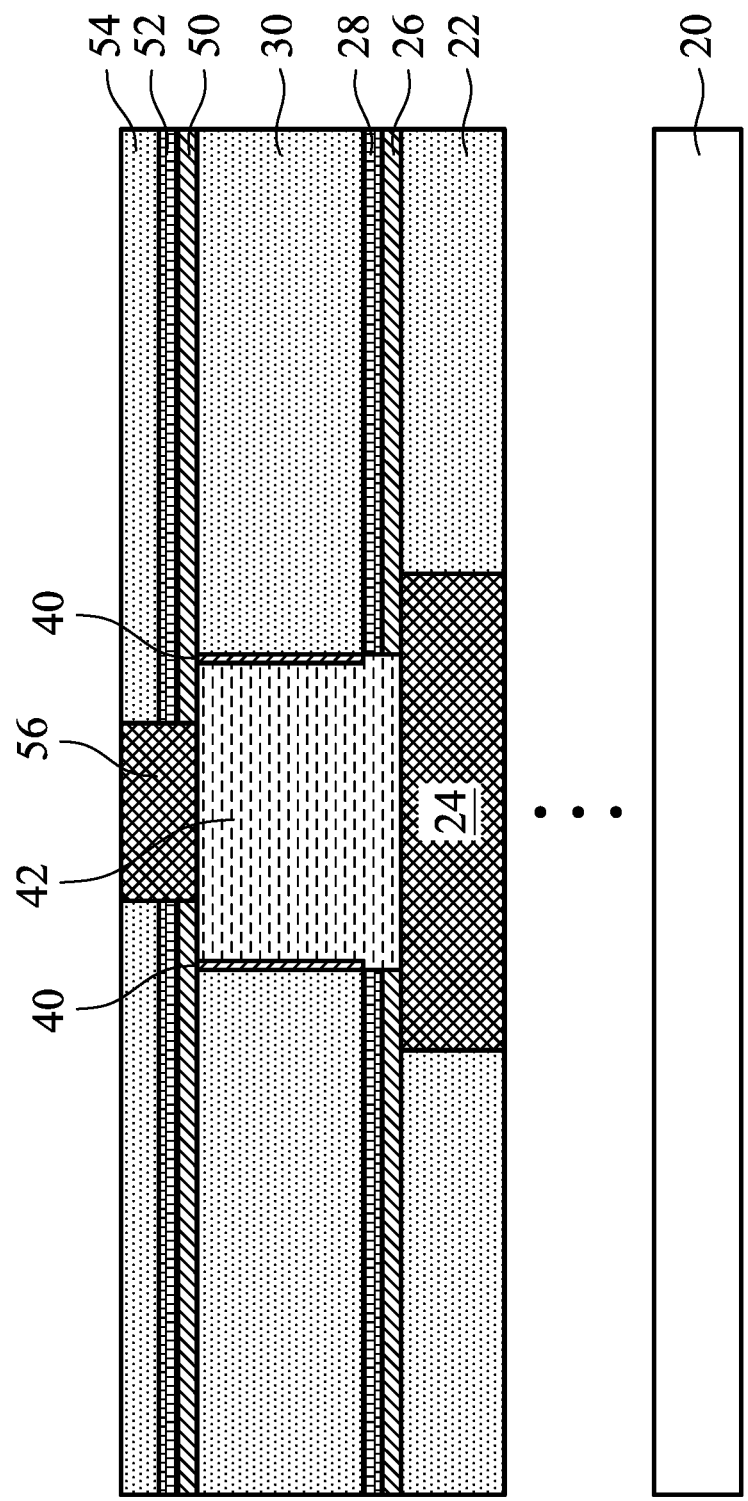

FIG. 6 illustrates the formation of a third etch stop sub-layer 50, a fourth etch stop sub-layer 52, a third dielectric layer 54, and a conductive feature 56. The third etch stop sub-layer 50 is formed over the second dielectric layer 30, the surface modification layer 40, and the conductive feature (comprising the conductive fill material 42). The fourth etch stop sub-layer 52 is formed over the third etch stop sub-layer 50. The third dielectric layer 54 is formed over the fourth etch stop sub-layer 52. The third etch stop sub-layer 50, the fourth etch stop sub-layer 52, and the third dielectric layer 54 can be formed as described above with respect to the first etch stop sub-layer 26, the second etch stop sub-layer 28, and the second dielectric layer 30, respectively, with reference to FIG. 1. In other examples, different layers may be formed, and/or different processes may be implemented.

An opening may be formed through the third dielectric layer 54, the fourth etch stop sub-layer 52, and the third etch stop sub-layer 50 to expose the conductive feature (comprising the conductive fill material 42) in the second dielectric layer 30. The conductive feature 56 may then be formed in the opening and contacting the conductive feature in the second dielectric layer 30. The opening and the conductive feature 56 may be formed as described above with respect to the opening 34 and conductive feature (comprising the conductive fill material 42), respectively, with reference to FIGS. 2 through 5. A surface modification layer may or may not be formed along sidewalls of the opening. A barrier layer (e.g., metal-nitride layer) may or may not be formed in the opening. In other examples, different materials and/or layers may be formed, and/or different processes may be implemented.

In some embodiments, the processing described above can implement a damascene process. A damascene process can be implemented to form a conductive line in a single damascene process, for example, or to form a conductive line with a via in a dual damascene process, for example. Some examples described herein may be implemented in a single damascene process or a dual damascene process. In some examples, various sidewalls and surfaces described herein may be of an opening in a dielectric layer for a conductive line and/or of an opening in a dielectric layer for a conductive line and a via. Surface modification layers may be implemented in a single damascene process or a dual damascene process and may be formed on the various surfaces formed by such processing. Other examples can be implemented in other processes.

In some examples, a barrier layer (e.g., a metal-nitride layer) is not conformally deposited in the opening 34 and does not form part of the conductive feature that includes the conductive fill material 42. The surface modification layer 40 may have barrier characteristics that can prevent extrusion or diffusion of the conductive fill material 42 into the second dielectric layer 30. For example, the more linear the organic functional groups that are included in the phosphoric acid derivative are, the more dense the surface modification layer 40 can be. A larger density of the surface modification layer 40 can contribute to the surface modification layer 40 having barrier characteristics. In some examples, a density of the surface modification layer 40 that has barrier characteristics can be in a range from $1 \times 10^{15}$ atoms/cm$^2$ to about $1 \times 10^{22}$ atoms/cm$^2$. Hence, a separate barrier layer can be omitted in some examples, although in other examples, a barrier layer can be included in addition to the surface modification layer 40. For example, in some examples, a barrier layer (such as of tantalum nitride or titanium nitride) is conformally deposited on the surface modification layer 40 before the conductive fill material 42 is deposited.

If a separate barrier layer is not included, resistance of the conductive feature that is formed can be reduced. Separate barrier layers can be formed of a metal-nitride, such as tantalum nitride or titanium nitride, and can be formed with a greater thickness than the surface modification layer 40. A conformal barrier layer can be formed along all surfaces of the opening 34, including a top surface of the conductive feature 24. Hence, such a conformal barrier layer would be formed disposed between the conductive feature 24 and the conductive fill material 42. When the conformal barrier layer is a metal-nitride (which can be a higher resistance material), a resistance of the conductive features can be increased due to the presence of the conformal nitride barrier layer between the conductive feature 24 and the conductive fill material 42. With the surface modification layer 40 being implemented without a separate barrier layer, no metal-nitride layer would be disposed between the conductive feature 24 and the conductive fill material 42, and hence, a resistance can be decreased. Additionally, a thickness of the surface modification layer 40 can be less than the thickness of a conformal barrier layer. Hence, a cross-sectional area of the conductive fill material 42 perpendicular to the flow of electrical current (e.g., parallel to the top surface of the conductive feature 24) can be greater when the surface modification layer 40 is implemented compared to when a barrier layer is implemented, assuming a same opening size. The greater cross-sectional area can result in a reduced resistance of the conductive feature that includes the conductive fill material 42. Further, with the surface modification layer 40 being implemented and not a separate barrier layer, and more particularly, with the surface modification layer 40 being a monolayer, a process window for forming the conductive feature that includes the conductive fill material 42 can be increased.

The surface modification layer 40, in some examples, is formed by a self-limiting reaction with the exposed surfaces of the second dielectric layer 30. Hence, in those examples, a monolayer of a given thickness can be formed regardless of duration of the exposure after the self-limiting reactions saturate the exposed surfaces. By saturating the exposed surfaces of the second dielectric layer 30, discontinuities in the surface modification layer 40 can be reduced (compared to other layers) or avoided. By reducing or avoiding discontinuities, a time dependent dielectric breakdown (TDDB) failure can be increased. For example, a TDDB failure of a structure formed without a surface modification layer was 14 years in some testing, while a structure formed with a surface modification layer was 370 years in some testing.

As described above, the surface modification layer 40 can repair damage to the second dielectric layer 30. Particularly, in some examples, the second dielectric layer 30 is a low-k dielectric of silicon oxycarbide ($SiO_xC_y$). The low-k dielectric, when exposed to a plasma, can have carbon depletion, which can increase the k-value of the dielectric. Further, processes performed on the low-k dielectric can result in hydroxide (—OH) groups terminating surfaces of the dielectric, which can further increase the k-value of the dielectric. As illustrated by FIGS. 7A through 7C, the formation of the surface modification layer 40 removes the hydroxide groups from the surfaces of the low-k dielectric to recover some of the k-value of the dielectric. Further, the organic functional groups that are included in the surface modification layer 40 can replenish carbon at the surfaces where the surface modification layer 40 is formed to thereby recover some of the k-value of the dielectric.

Accordingly, some embodiments can achieve reduced resistance, reduced extrusion or diffusion of conductive material, increased TDDB failure times, and recovered k-values. These can, together and/or individually, increase passing rates of wafer acceptance testing (WAT) and increase yield. Some embodiments may be implemented at any technology node, and more particularly, may be implemented at a 10 nm technology node and smaller.

An embodiment is a structure. The structure includes a dielectric layer over a substrate, a surface modification layer, and a conductive feature. The dielectric layer has a sidewall. The surface modification layer is along the sidewall, and the surface modification layer includes phosphorous and carbon. The conductive feature is along the surface modification layer.

Another embodiment is a structure. The structure includes a first dielectric layer, a first conductive feature, a second dielectric layer, a surface modification layer, and a second conductive feature. The first dielectric layer is over a substrate. The first conductive feature is disposed in the first dielectric layer. The second dielectric layer is over the first dielectric layer, and the second dielectric layer has sidewalls. The surface modification layer is along the sidewalls of the second dielectric layer, and the surface modification layer includes phosphorous and carbon. The second conductive feature is disposed between the sidewalls of the second dielectric layer, and the second conductive feature contacts the first conductive feature.

A further embodiment is a method for semiconductor processing. An opening is etched through a dielectric layer. The dielectric layer is over a substrate. Surfaces of the dielectric layer that define the opening are exposed to a phosphoric acid derivative. A conductive fill material is deposited in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    depositing a first dielectric layer and a second dielectric layer over a conductive region, the conductive region being over a semiconductor substrate;
    forming an opening through both the first dielectric layer and the second dielectric layer to expose the conductive region; and
    replacing OH groups on a surface of the second dielectric layer within the opening with a monolayer comprising phosphoric acid derivative molecules, the monolayer having a thickness no thicker than a length of one of the phosphoric acid derivative molecules, wherein the first dielectric layer is free from the monolayer.

2. The method of claim 1, wherein the first dielectric layer has a thickness between 1 nm to 10 nm.

3. The method of claim 1, further comprising, after the forming the opening and before the replacing the OH groups, performing a bake process.

4. The method of claim 3, wherein the bake process is performed at a temperature in a range between 200° C. and 400° C. for a duration of between 5 minutes and 10 minutes.

5. The method of claim 1, wherein the semiconductor substrate comprises vertical gate all around FETs.

6. The method of claim 1, wherein the depositing the first dielectric layer and the second dielectric layer is part of a back end of line process.

7. The method of claim 1, wherein the depositing the first dielectric layer and the second dielectric layer is part of a middle end of line process.

8. A method of manufacturing a semiconductor device, the method comprising:
    forming a first sidewall of dielectric materials over a conductive region over a semiconductor substrate; and
    covering a first portion but not a second portion of the first sidewall with a monolayer, the monolayer comprising phosphoric acid derivative molecules, the monolayer having a thickness no thicker than a length of one of the phosphoric acid derivative molecules.

9. The method of claim 8, further comprising depositing a conductive material in physical contact with the monolayer and the second portion of the first sidewall.

10. The method of claim 8, wherein the forming the first sidewall comprises:
    forming a first etch stop layer;
    forming a second etch stop layer over the first etch stop layer; and
    forming a dielectric layer over the second etch stop layer.

11. The method of claim 10, wherein the first etch stop layer comprises 1 nm to 10 nm of silicon oxynitride.

12. The method of claim 11, wherein the second etch stop layer comprises 1 nm to 10 nm of silicon nitride.

13. The method of claim 8, wherein the first sidewall has a positive taper profile.

14. The method of claim 8, wherein the first sidewall has a reentrant profile.

15. A method of manufacturing a semiconductor device, the method comprising:
    lining only a portion of a sidewall of an opening with a monolayer, the monolayer comprising phosphoric acid derivative molecules, the monolayer having a thickness no thicker than a length of one of the phosphoric acid derivative molecules; and
    filling the opening with a conductive material to make electrical connection with an underlying conductive region over a semiconductor substrate, the conductive material being free from a barrier layer.

16. The method of claim 15, wherein the opening has an aspect ratio of a depth to a width of between 3 to 6.

17. The method of claim 15, wherein after the filling the opening the monolayer laterally surrounds the conductive material.

18. The method of claim 15, wherein the lining is performed at least in part using a wet process at a temperature in a range from 20° C. to 60° C.

19. The method of claim 15, wherein the lining is performed at least in part using a dry process at a pressure in a range from 10 mTorr to 1 Torr, and a temperature in a range from 20° C. to 100° C.

20. The method of claim 19, wherein the dry process is performed without a plasma.

* * * * *